United States Patent [19]

Frary et al.

[11] Patent Number: 5,245,574

[45] Date of Patent: Sep. 14, 1993

[54] APPARATUS FOR INCREASING THE SPEED OF OPERATION OF NON-VOLATILE MEMORY ARRAYS

[75] Inventors: Kevin W. Frary, Fair Oaks; George Canepa, Folsom; Sherif Sweha, El Dorado Hills, all of Calif.

[73] Assignee: Intel Corporation, Santa Clara, Calif.

[21] Appl. No.: 812,631

[22] Filed: Dec. 23, 1991

[51] Int. Cl.[5] .............................................. G11C 7/00
[52] U.S. Cl. .................................. 365/189.09; 365/203
[58] Field of Search ............... 365/189.09, 203, 208, 365/210

[56] References Cited

U.S. PATENT DOCUMENTS

| | | | |
|---|---|---|---|
| 4,388,705 | 6/1983 | Sheppard | 365/210 |
| 4,780,850 | 10/1988 | Miyamoto | 365/189.09 |
| 4,879,682 | 11/1989 | Engles | 365/207 |
| 4,982,367 | 1/1991 | Miyatake | 365/203 |
| 5,023,839 | 6/1991 | Suzuki | 365/185 |
| 5,063,540 | 11/1991 | Takahashi | 365/189.09 |
| 5,091,888 | 2/1992 | Akaogi | 365/189.09 |
| 5,117,394 | 5/1992 | Amin | 365/203 |

Primary Examiner—Eugene R. LaRoche
Assistant Examiner—A. Zarahian
Attorney, Agent, or Firm—Blakely, Sokoloff, Taylor & Zafman

[57] ABSTRACT

In a memory array having a plurality of bitlines each connected to a plurality of memory devices having a state in which current is transferred by the memory device and a state in which current is not transferred by the device, a column select device for activating each bitline, a plurality of wordlines for activating individual memory devices joined to each bitline, apparatus for providing constant current in the conducting state of a memory device connected to a bitline, a device connecting a source voltage to a plurality of bitlines, and a reference bitline for providing an output reference signal, the improvement including apparatus for providing a source of current in addition to current through the device connecting a source voltage to a plurality of bitlines in order to charge any capacitance of a selected bitline when that bitline is selected whereby switching between memory devices joined to different bitlines is accelerated.

11 Claims, 3 Drawing Sheets

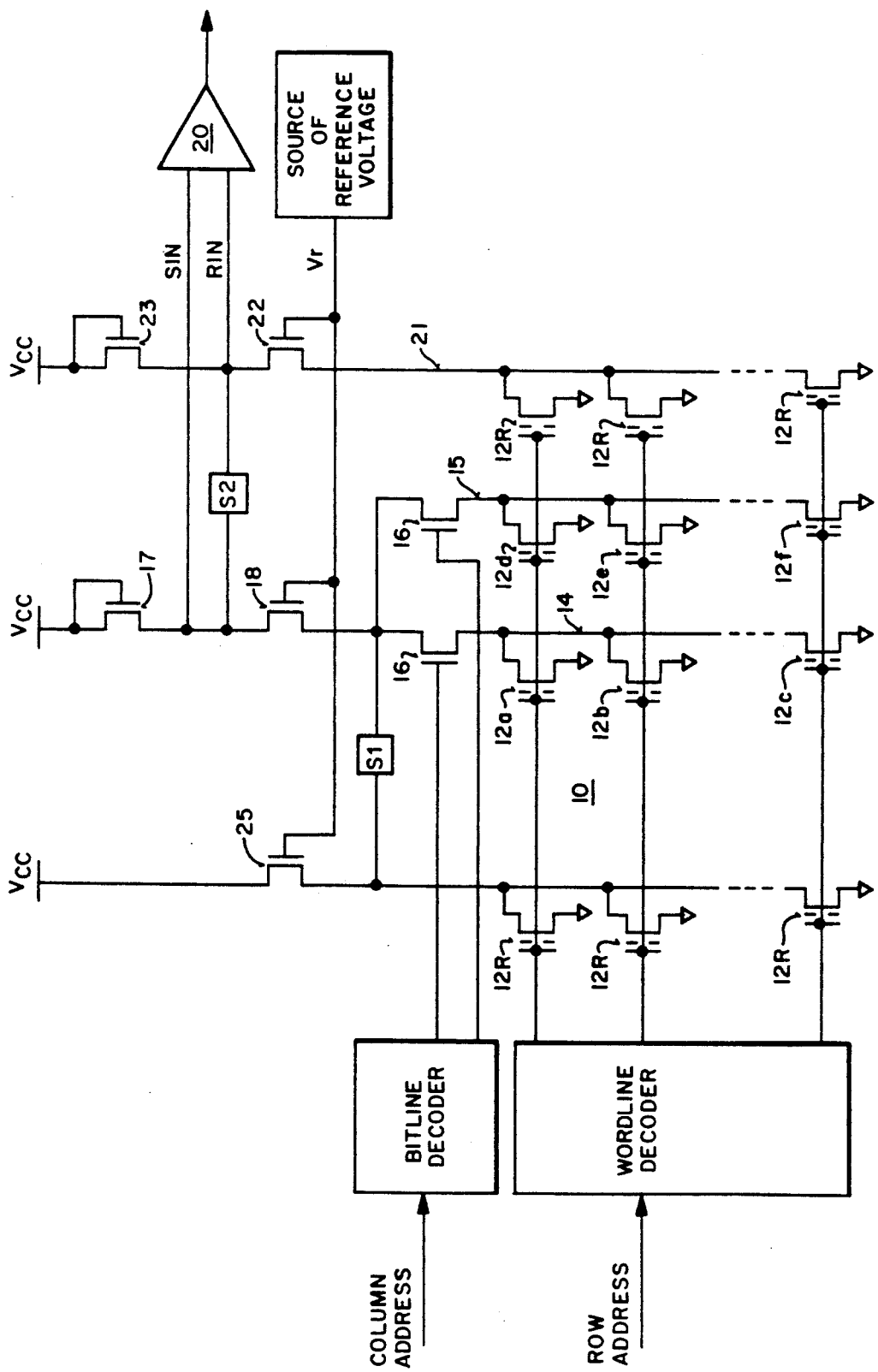
FIG—1

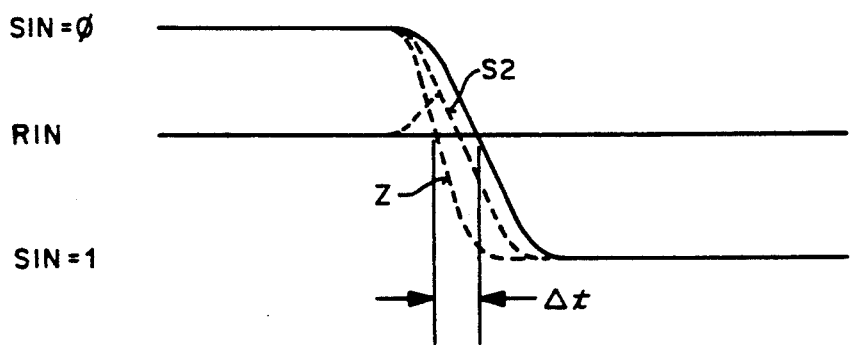
FIG_2
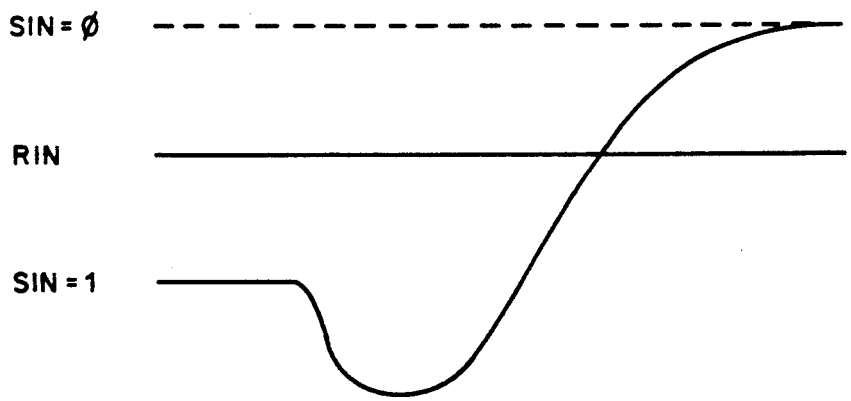
FIG_3
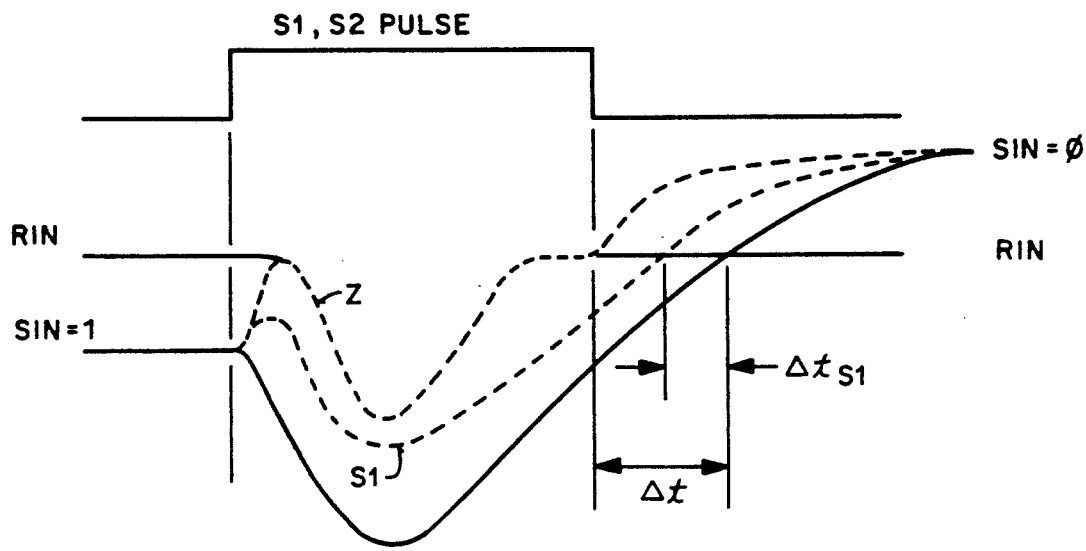
FIG_4

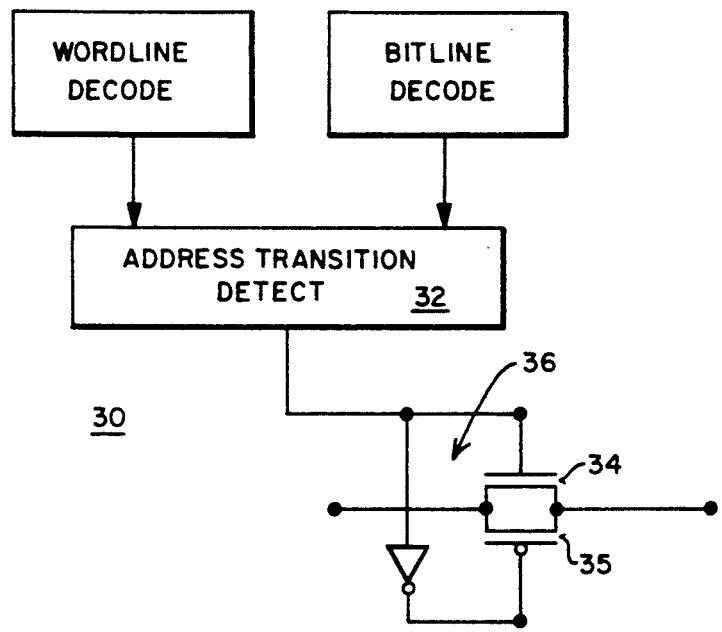
FIG_5A
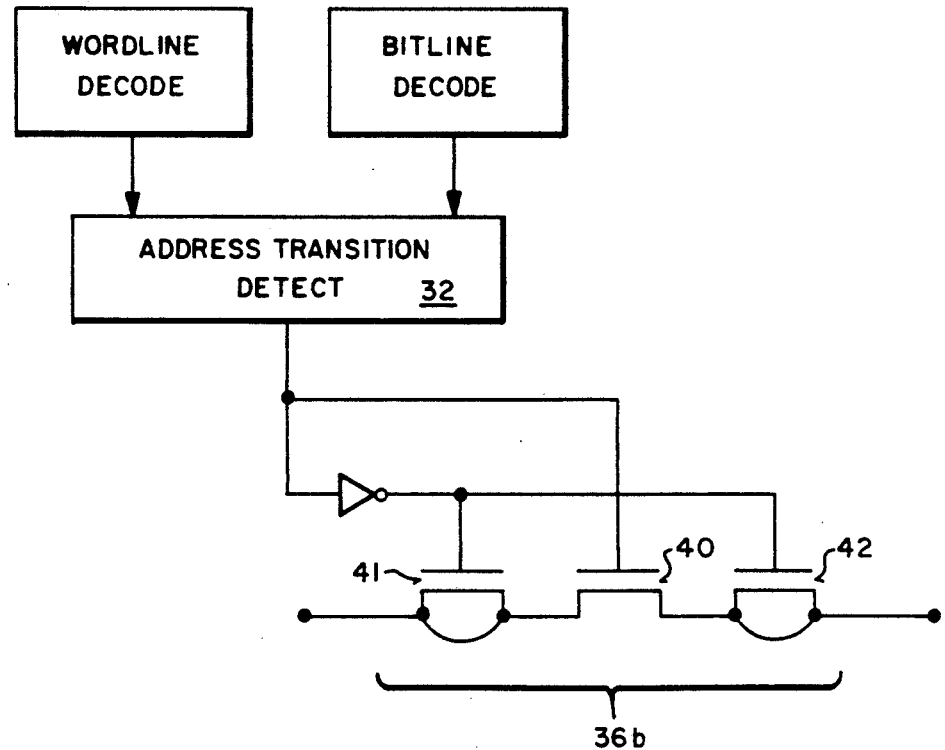
FIG_5B

APPARATUS FOR INCREASING THE SPEED OF OPERATION OF NON-VOLATILE MEMORY ARRAYS

BACKGROUND OF THE INVENTION

1. Field of the Invention

This invention relates to non-volatile memory arrays and, more particularly, to apparatus for helping such arrays to switch at faster rates.

2. History of the Prior Art

There are a number of types of non-volatile memory arrays utilized to store digital information. Erasable read only memory (EPROM) and extensions of EPROM are used for many purposes. In general, such arrays are comprised of many transistors arranged in rows and columns with selection circuitry for determining the particular transistors to access. There has been a general tendency for such arrays (as for all memory arrays) to grow larger by including more and more memory transistors. As the number of transistors in a memory array connected to any selection line (such as a wordline or bitline) increases so does the capacitance affecting the line. This has the general tendency of slowing the rate at which switching can be accomplished. At the same time that the number of transistors in memory arrays is growing larger, the size of the individual transistor devices is growing smaller. Consequently, along with this increase in capacitance has come a reduction of the current which can be transferred by the individual memory devices and a consequent slowing of the switching. Since the smaller transistors cannot transfer as much current, charging the capacitance of any selection line takes longer. These twin tendencies associated with the growth of the size of memory arrays have the effect of slowing the ability of the selection circuitry to switch between memory positions.

SUMMARY OF THE INVENTION

It is, therefore, an object of the present invention to speed the access to the memory devices of non-volatile memory arrays.

It is another more specific object of the present invention to provide arrangements for more rapidly charging the selection lines of non-volatile memory arrays.

These and other objects of the present invention are realized in a memory array having a plurality of bitlines each connected to a plurality of memory devices having a state in which current is transferred by the memory device and a state in which current is not transferred by the device, a column select device for activating each bitline, a plurality of wordlines for activating individual memory devices joined to each bitline, means for providing constant current in the conducting state of a memory device connected to a bitline, a device connecting a source voltage to a plurality of bitlines, and a reference bitline for providing an output reference signal, the improvement comprising means for providing a source of current in addition to current through the device connecting a source voltage to a plurality of bitlines in order to charge any capacitance of a selected bitline when that bitline is selected whereby switching between memory devices joined to different bitlines is accelerated.

In an enhanced embodiment of the invention means is provided for equating the voltage levels of the bitline selected and a reference bitline so that switching between rows may be accomplished more rapidly.

These and other objects and features of the invention will be better understood by reference to the detailed description which follows taken together with the drawings in which like elements are referred to by like designations throughout the several views.

BRIEF DESCRIPTION OF THE DRAWINGS

FIG. 1 is a circuit diagram illustrating the present invention.

FIG. 2 is a diagram illustrating wave forms at certain positions in the circuit illustrated in FIG. 1.

FIG. 3 is another diagram illustrating wave forms at certain positions in the circuit illustrated in FIG. 1.

FIG. 4 is another diagram illustrating wave forms at certain positions in the circuit illustrated in FIG. 1.

FIG. 5(a) and (b) are circuit diagrams illustrating details of the circuit of FIG. 1.

DETAILED DESCRIPTION OF THE INVENTION

Referring now to FIG. 1, there is shown a memory array 10 constructed in accordance with the present invention. The array 10 includes a plurality of metal-oxide-silicon (MOS) devices 12 each of which stores a condition which may be sensed as a binary one or a binary zero. In the EPROM type of memory array with which the present invention may be used, the devices 12 are floating gate N channel field effect transistor devices. Such devices are constructed and connected in circuit so that when programmed, they do not transfer current between source and drain terminals and are considered to store a logic zero. When not programmed, the devices 12 do conduct current between source and drain terminals and are considered to store a one condition.

A number of the devices 12a, 12b, and 12c have their drain terminals connected to the same bitline 14. Typically, one thousand devices 12 might be so connected to the same bitline. Another one thousand devices 12 are similarly connected to a second bitline 15 as illustrated by the devices 12d, 12e, and 12f. The source terminals of each of the transistors 12 are connected to ground. The drain terminals of all of the devices 12 connected to any single bitline may be connected through the source and drain terminals of an N channel field effect transistor (FET) 16 which acts as a column select transistor. A plurality of such column select transistors 16 connect a number of bitlines to another N channel field effect transistor 17 which is joined to a source voltage Vcc. Each of the devices 17 is biased "on" to provide current to a bitline when a column select device 16 is enabled to complete a path from the source voltage Vcc.

Connected between the column select devices 16 and the device 17 is another N channel FET device 18. The device 18 is provided to control the current through the bitlines so that a voltage may be sensed at an SIN terminal which will represent either a logic one or a zero. For this purpose, the gate of the device 18 is connected to a source of reference voltage so that the current through the device 18 remains relatively constant when a device 12 is conducting (a data value of one) and restricts but still holds constant the current through the device 18 when a device 12 is not conducting (a data value of zero). Thus, the voltage at the SIN terminal is high indicating a zero when a particular column is selected and a device 12 in that column which stores a zero is read. This high voltage is essentially equal to the source voltage Vcc less the voltage drop Vt across the device 17 since no current is flowing. On the other hand, when the device 12 being read stores a one condition and conducts, the voltage at the SIN terminal is equal to the source voltage Vcc less the voltage drop Vt across the device 17 less the source-to-drain impedance of the device 17 multiplied by the current, a lower level of voltage. The voltage at the SIN terminal is furnished to one input terminal of a differential amplifier 20 which functions as a sense amplifier.

The gate terminals of one of the devices 12 connected to each bitline are connected to a single wordline. By decoding an address to select a particular wordline and a particular bitline, the condition of any individual memory device 12 may be sensed. To accomplish this, the voltage at the SIN terminal is compared to a reference voltage produced at an RIN terminal of a reference bitline 21. The reference bitline 21 is designed only to produce a constant voltage at the RIN terminal against which the SIN voltages may be compared by the sense amplifier 20. To accomplish this, the reference bitline 21 is connected to a plurality of reference memory devices 12R none of which is programmed. An N channel FET current control transistor 22 is arranged in the reference bitline to provide a constant current, and an N channel FET device 23 is connected to the source of voltage Vcc and biased on. The reference devices 12R are of the same size as the memory devices 12(a-f), and the current control device 22 is of the same size as the current control device 18. However, the transistor 23 is of a size that it transfers substantially more current than does the transistor 17. Since the devices 12R are not programmed, current flows through the transistor 23 when any device 12R is selected. Consequently, there is a voltage drop due to current through the device 23, and the voltage at the terminal RIN is always less than the voltage level at the SIN terminal which indicates a zero value. Moreover, the transistor 23 is constructed such that the voltage RIN is always greater than the voltage level at the SIN terminal which indicates a one value. The typical values of the voltages produced at the SIN and RIN terminals are illustrated in the graph of FIG. 2.

Reviewing the voltages at the SIN terminal in FIG. 2, it may be seen that some incremental time is required for the transition between a zero value and a one value at that terminal when switching between devices 12 on the same bitline. This time is controlled to a substantial extent by the time required to charge and discharge the residual capacitance of the bitlines when switching between devices 12 which store different conditions on any individual bitline. As was pointed out above, as the number of devices 12 connected to a bitline increases, so does the residual capacitance of the bitline. This has the effect of increasing the time constant necessary for charging that capacitance. In addition, each of the devices 12 has grown smaller as the number of devices has increased. Consequently, the individual devices 12 cannot carry as much current as could previous memory devices; and the charging rate is further slowed.

A similar situation occurs when switching between a device 12 connected to one bitline which stores a one value and a device 12 connected to another bitline which stores a zero. As is shown in FIG. 3, when switching first occurs, the transistor 17 and the transistor 18 are conducting current through the previously selected device 12. Consequently, the voltage level at the SIN terminal is determined by the source voltage Vcc less the voltage drop Vt across the transistor 17 less the source-to-drain impedance of the device 17 multiplied by this current. When the address is switched to a new bitline whose voltage is initially at ground and which joins a device 12 storing a zero that is to be read, a large current initially flows through the transistors 17 and 18 to charge the capacitance of the bitline. This provides an additional voltage drop measured by the value of the current through and the impedance of the transistor 17. This voltage drop lowers the value of the voltage at the SIN terminal drastically. The capacitance of the newly selected bitline must receive sufficient charge to overcome this lower voltage before the output voltage level at the SIN terminal can start to charge toward a zero level and become greater than the RIN voltage so that it may be measured. Consequently, the time required to switch between detectable conditions is delayed. After the capacitance of the second bitline has had a chance to charge, the voltage at the SIN terminal ultimately assumes the proper level to indicate a zero.

In order to accelerate the operation of switching between memory cells which store different conditions whether joined to the same bitline or joined to different bitlines, the circuitry of the present invention is utilized. In order to allow the capacitance of the bitlines to charge at a faster rate, an additional source of current is provided. An N channel FET device 25 is connected with its drain terminal at the source voltage Vcc, its gate biased by the reference voltage Vr, and its source terminal connected to ground through an additional number of reference devices 12R. Each of the devices 12R is unprogrammed and joined to one of the wordlines so that, when any wordline has been selected, current is flowing through the device 25. The path through the device 25 and one of the devices 12R thus forms another reference bitline. The device 25 may be made as strong as desired so that it provides sufficient current to add to the charging current from the device 17. The manner of determining a best value is explained hereinafter.

In order to provide this additional current to the selected bitline, a switching device S1 is provided. The device S1 is devised so that it turns on when an address change occurs and provides current from the device 25 to charge the capacitance of the selected bitline. The switching device S1 turns off as soon as the capacitance is close to being charged so that the value of the voltage at the SIN terminal may be measured. This is especially important in the case in which a new bitline is selected; and as may be seen from the dotted curve S1 in FIG. 4, the additional current available to charge the capacitance of the bitline which has been selected eliminates the drastic drop at the SIN terminal and allows the bitline to charge faster. The value delta tS1 on the X axis of the graph in FIG. 4 illustrates the savings in time using the switching device S1 to transfer additional current to the selected bitline. Typically, the acceleration for the sense amplifier section of the array is approximately 15%; however, this will depend on the characteristics of the particular memory array.

In addition to the provision of the additional current source provided by the device 25 and the switching device S1, an additional switching device S2 may be provided to join together the two terminals SIN and RIN. This switching device S2 may be closed when an address change occurs and joins the SIN terminal to the RIN terminal. When this occurs, the voltage at the SIN terminal is brought closer to the original level of the RIN terminal as is shown by the dotted curve labelled S2 in FIG. 2. The switching device S2 is then opened so that the SIN terminal may continue toward its new condition. As may be seen in FIG. 2, substantial time is saved in making the row transition.

However, even joining the two terminals together does not, in fact, cause the SIN terminal to drop to the level of the RIN terminal but to a level approximately half way between. In order to bring the terminals together more rapidly, the values of the transistors themselves may be manipulated. The necessary condition for the two voltages to be equal is that the current through the device 17 be equal to the current through the device 23 times the ratio of $Z_{17}$ to $Z_{23}$, where Z equals the width of any device channel divided by the length of that channel. In order to accomplish this, it can be shown that the devices of the circuit should be constructed so that $Z_{25}/Z_{18}=(Z_{23}/Z_{17})-1$, where $Z_{18}=Z_{22}$, and the devices 12R in the second reference bitline are the same size as the devices 12R in the first reference bitline so the currents in those bitlines are equal. In such a case, the voltage at the terminal SIN will immediately drop to the voltage at the terminal RIN causing the time for switching between rows to be accomplished in the desired manner. This condition is also achieved after switching has occurred between bitlines. This is illustrated by the dotted curve labelled Z shown in FIG. 4. It may be seen that the time saved in making the row transition is equal to the time delta t illustrated on the X axis of FIGS. 2 and 4.

Thus, the invention allows both types of transitions, those between rows joined to the same bitline and those between columns, to be accomplished more rapidly. Consequently, the switching speed of the memory array is substantially enhanced.

In order to accomplish the switching of the switching devices S1 and S2, circuits such as the circuit 30 illustrated in FIG. 5a may be utilized. The circuit 30 includes a detector 32 which receives an address input signal when it is transferred to an address buffer and provides a pulse output having leading and trailing edges separated by a prescribed time period. This may be accomplished by a series of inverter circuits selected to provide an appropriate delay based on the time required to charge the capacitance of the bitlines. The pulse produced by the detector 32 is transferred to the gates of the transistors 34 and 35 of a transmission gate 36. This causes the transmission gate 36 to conduct current during the period in which the pulse from the detector 32 is applied. One such circuit 30 may be utilized as the switching device S1 by sensing the input signal to the address input to the column selectors 16 and to the address input to the wordlines. Another such circuit 30 may be utilized as the switching device S2. This circuit 30 used as the switching device S2 also senses the input signal to the address input to the column selectors 16 and to the address input to the wordlines.

In the preferred embodiment of the invention, the transmission gate 36 is replaced by the circuit 36b shown in FIG. 5b. This circuit 36b uses a single N channel FET 40 as a switching device. Included in series with the device 40 are a pair of N channel FETs 41 and 42. Each of the devices 41 and 42 has it source and drain terminals shorted together to provide a constantly connected current path. The devices 41 and 42, however, each have their Z values (width of channel divided by length of channel) selected to be approximately one-half the Z value of the device 40. The devices 41 and 42 also receive input signals inverted from that provided to the device 40. The effect of the devices 41 and 42 is to provide gate-to-source and drain parasitic capacitances which balance out the gate-to-source and drain parasitic capacitances of the device 40. Thus, any charge coupling incident to the switching of the 40 is balancing out by an essentially equal value of opposite polarity provided by the devices 41 and 42. This significantly reduces capacitive delay in the switching.

It is possible to connect the device S1 so that it is activated only when a change occurs in the selection of a bitline and the device S2 so that it is activated only when a change occurs in the selection of a wordline. However, in the preferred embodiment of the invention both of the devices S1 and S2 are connected so that any address change generates the pulse described and both devices turn on. This has been found to provide the desired increase in speed without the necessity of additional circuitry for individually selecting the devices S1 and S2 to implement the invention.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. An improvement in a memory array, the memory array including a first plurality of bitlines, a second plurality of memory devices, each memory device being connected to one bitline of the plurality of bitlines, each memory device having a first state in which current is transferred and a second state in which current is not transferred, a column select device for selectively activating a selected bitline of the plurality of the bitlines, a third plurality of wordlines for activating a selected memory device of the second plurality of memory devices, the third plurality of wordlines forming rows within the memory array, an entire row being activated when the selected memory device is activated, the selected memory device being connected to the selected bitline, means for providing a first constant current to the selected memory device, means for connecting a source voltage to the first plurality of bitlines, and a first reference bitline for providing an output reference signal, the improvement comprising:
    a) a first means for providing a second current to the selected memory device to accelerate switching to the selected memory device, the means for providing a second current including:
       1) a second reference bitline to charge any capacitance of the selected bitline when the selected bitline is selected; and
       2) a second means for joining the second reference bitline to the selected bitline when the selected bitline is selected and for disconnecting the second reference bitline from the selected bitline before the selected memory device is sensed.

2. In a memory array as claimed in claim 1, the second means comprising a transmission gate.

3. In a memory array as claimed in claim 1, the second means comprising a first FET switching device, and a third means for balancing out switching capacitances of the first FET switching device.

4. In a memory array as claimed in claim 3, the third means including a second FET switching device having a drain terminal and a source terminal, the drain and source terminals of the second FET switching device being connected together in a path switched by the first FET switching device, and the second FET switching device having a gate terminal connected to receive signals directed to the first FET switching device.

5. In a memory array as claimed in claim 1, the improvement further comprising a fourth means for equating a voltage level of the selected bitline with the first reference bitline so that switching to a newly activated row may be accomplished more rapidly.

6. In a memory array as claimed in claim 5, the fourth means comprising a fifth means for joining the first reference bitline to the selected bitline when the selected bitline is selected and for disconnecting the first reference bitline from the selected bitline before the selected memory device is sensed.

7. In a memory array as claimed in claim 6, the fifth means comprising a transmission gate.

8. In a memory array as claimed in claim 6, the second means comprising a transmission gate.

9. In a memory array as claimed in claim 6, the second means comprising a first FET switching device, and means for balancing out switching capacitances of the first FET switching device.

10. In a memory array as claimed in claim 9, the fourth means comprising at least a second FET switching device having a drain terminal and a source terminal connected together in a path switched by the first FET switching device, and a gate terminal connected to receive signals directed to the first FET switching device.

11. In a memory array as claimed in claim 5, the fourth means including means for selecting current levels to equate the voltage level of the selected bitline with the voltage level of the first reference bitline.

* * * * *